US009436215B2

(12) United States Patent
Viallet et al.

(10) Patent No.: US 9,436,215 B2
(45) Date of Patent: Sep. 6, 2016

(54) TOUCH SURFACE AND METHOD OF MANUFACTURING SAME

(71) Applicants: NANOMADE CONCEPT, Toulouse (FR); INSTITUT NATIONAL DES SCIENCES APPLIQUEES DE TOULOUSE, Toulouse (FR); CENTRE NATIONAL DE LA RECHERCHE SCIENTIFIQUE, Paris (FR)

(72) Inventors: Benoît Viallet, Toulouse (FR); Laurence Ressier, Toulouse (FR); Jérémie Grisolia, Aussonne (FR); Lionel Songeon, Tournefeuille (FR); Eric Mouchel La Fosse, Tournefeuille (FR); Lukas Czornomaz, Toulouse (FR)

(73) Assignee: NANOMADE CONCEPT, Toulouse (FR)

( * ) Notice: Subject to any disclaimer, the term of this patent is extended or adjusted under 35 U.S.C. 154(b) by 0 days.

(21) Appl. No.: 14/734,452

(22) Filed: Jun. 9, 2015

(65) Prior Publication Data

US 2015/0268692 A1 Sep. 24, 2015

Related U.S. Application Data

(63) Continuation of application No. 13/813,352, filed as application No. PCT/EP2011/063205 on Aug. 1, 2011, now abandoned.

(30) Foreign Application Priority Data

Aug. 2, 2010 (FR) ...................................... 10 56387

(51) Int. Cl.
*G01R 27/28* (2006.01)
*G06F 3/045* (2006.01)
(Continued)

(52) U.S. Cl.
CPC .................. *G06F 1/16* (2013.01); *G01L 1/144* (2013.01); *G01L 1/146* (2013.01); *G01L 1/205* (2013.01);
(Continued)

(58) Field of Classification Search
CPC ... G01R 27/02; G01R 27/2605; G06F 3/045; G06F 3/044; G06F 2203/04107; G06F 2203/04111; G06F 2203/04112; G01N 2021/7789; G01N 21/7746
USPC .......... 324/76.11–76.83, 600, 649, 652, 655, 324/668, 675, 682, 691, 708; 345/174
See application file for complete search history.

(56) References Cited

U.S. PATENT DOCUMENTS

| 7,116,209 B2 | 10/2006 | Hermann et al. |
| 2008/0238882 A1 | 10/2008 | Sivarajan et al. |
| 2009/0001983 A1* | 1/2009 | Wittkowski ........... G01R 33/06 324/260 |
| 2009/0046073 A1 | 2/2009 | Pennington et al. |

(Continued)

FOREIGN PATENT DOCUMENTS

| EP | 2 053 495 A2 | 4/2009 |
| WO | 03/018307 A1 | 3/2003 |

OTHER PUBLICATIONS

Herrmann et al, "Nanoparticle films as sensitive strain gauges," Applied Physics Letters, Oct. 30, 2007, pp. 183105-1 to 183105-3,, vol. 91, No. 18, American Institute of Physics, Melville, NY, US.

*Primary Examiner* — Huy Q Phan
*Assistant Examiner* — Raul Rios Russo
(74) *Attorney, Agent, or Firm* — IM IP Law PLLC

(57) ABSTRACT

A device to detect and quantify a force applied on a surface includes a test specimen, an electrically insulating substrate, a first electrode bound to the substrate, a second electrode, an assembly of conductive or semi-conductive nanoparticles in contact with the two electrodes, and a measurement device. The measurement device provides proportional information with respect to an electrical property of the nanoparticles assembly. The electrical property is measured between the first and second electrode. The test specimen is the nanoparticles assembly itself and the electrical property is sensitive to the distance between the nanoparticles of the assembly. The nanoparticles assembly itself is used as a test specimen and allows a force to be quantified even if the nanoparticles assembly is deposited on a rigid substrate.

13 Claims, 4 Drawing Sheets

(51) Int. Cl.
  *G06F 1/16* (2006.01)
  *G01L 1/14* (2006.01)
  *G01L 1/20* (2006.01)
  *G06F 3/041* (2006.01)
  *G06F 3/044* (2006.01)
  *G01R 27/02* (2006.01)
  *G01R 27/26* (2006.01)

(52) U.S. Cl.
  CPC .......... *G01R 27/02* (2013.01); *G01R 27/2605* (2013.01); *G06F 3/041* (2013.01); *G06F 3/044* (2013.01); *G06F 3/045* (2013.01); *G06F 3/0414* (2013.01); *G06F 3/0416* (2013.01); *G06F 2203/04103* (2013.01); *G06F 2203/04105* (2013.01)

(56) References Cited

U.S. PATENT DOCUMENTS

| | | | |
|---|---|---|---|
| 2009/0087622 A1* | 4/2009 | Busnaina | B81C 1/00031 428/173 |
| 2009/0101488 A1 | 4/2009 | Jiang et al. | |
| 2009/0153511 A1 | 6/2009 | Jiang et al. | |
| 2009/0293631 A1* | 12/2009 | Radivojevic | G01L 1/16 73/774 |
| 2009/0314644 A1* | 12/2009 | Golan | B01F 13/0076 204/643 |
| 2010/0237744 A1* | 9/2010 | Koker | B81B 3/0035 310/330 |
| 2013/0228018 A1* | 9/2013 | Mouchel La Fosse | A61B 5/02158 73/753 |

* cited by examiner

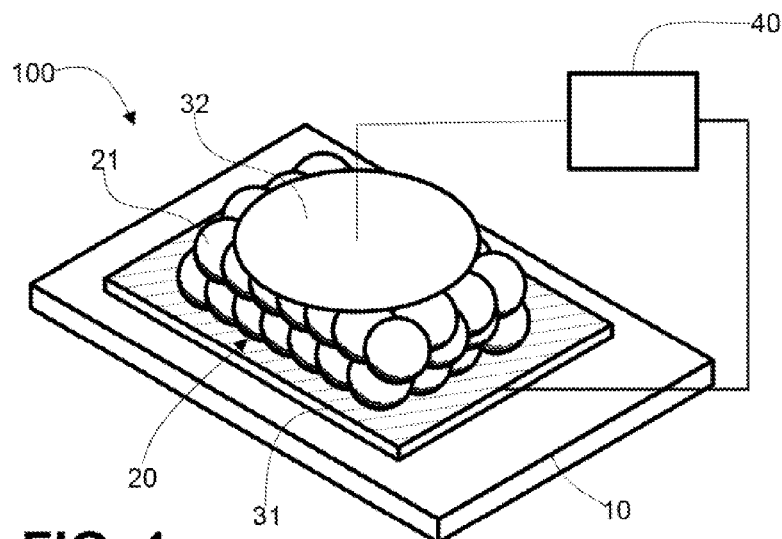
FIG. 1
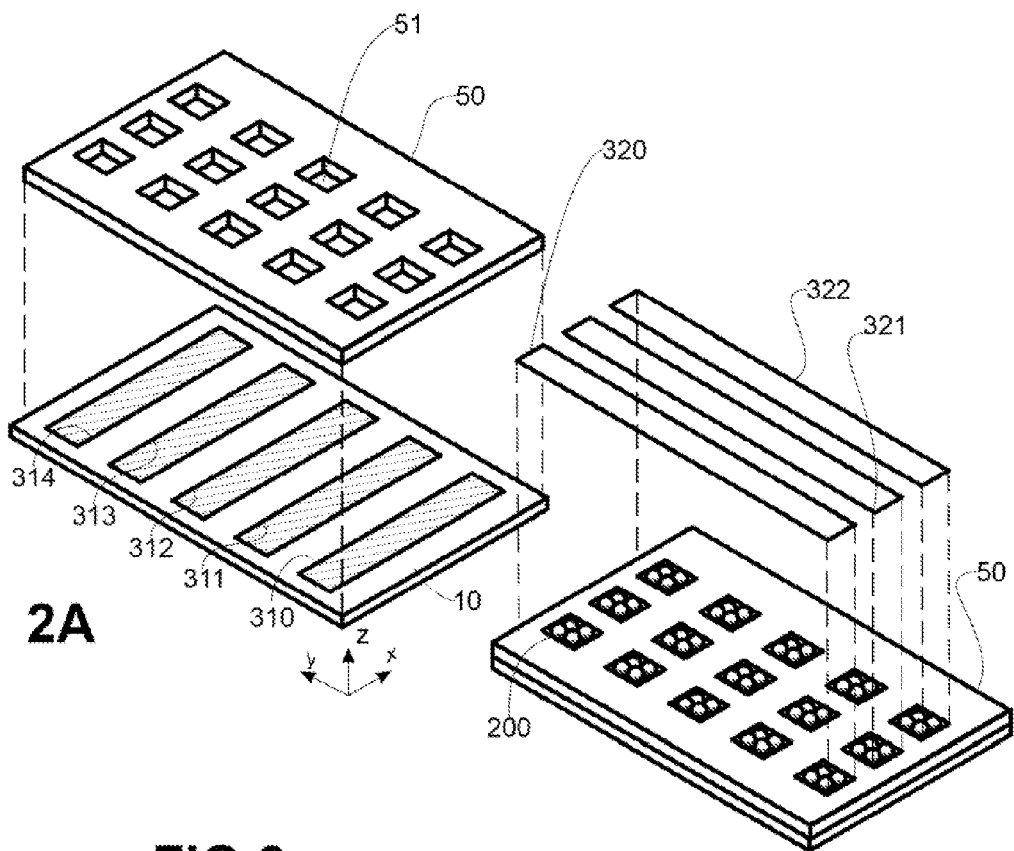
FIG. 2  2A  2B

TOUCH SURFACE AND METHOD OF MANUFACTURING SAME

RELATED APPLICATIONS

The present application is a continuation of application Ser. No. 13/813,352 filed Apr. 3, 2013, which is a §371 application from PCT/EP2011/063205 filed Aug. 1, 2011, which claims priority from French Patent Application No. 10 56387 filed Aug. 2, 2010, each of which is herein incorporated by reference in its entirety.

TECHNICAL FIELD OF INVENTION

The invention belongs to the field of touch surfaces and relates to such a surface, its method of realization and its use for detecting and measuring forces applied on such a surface. This type of surface is used, for example, in many mass-market electronic applications, in particular computer applications, under different forms, called "touch pad", "touch screen", "write pad", etc.

BACKGROUND OF THE INVENTION

In these examples of the prior art, the touch surfaces are configured so as to detect one or more contacts, which can be from a finger or by means of an accessory such as a stylus. When they comprise a plurality of sensors arranged according to a matrix organization, they allow the movement of said points of contact to be tracked.

The surfaces of the prior art are made functional, or functionalized, by means of sensors that measure the variation in a physical property during the contact with a finger or with an accessory on the touch surface.

The main physical properties measured, according the art, are resistivity or electrical resistance and the variation in electrical capacitance. There are also technologies based on the emission of ultrasounds or infrared rays.

The touch surfaces of the prior art can primarily detect the contact, but cannot quantify it. 'Quantify' means to determine the pressure or the resulting contact force, the direction of this resulting force when it comprises components other than normal to the touch surface, and the coordinates of the point of application of this force in a reference space linked to the touch surface, the contact forces applied to such a touch surface being essentially normal to said surface. According to certain embodiments of the prior art, said contact must be applied with a sufficient force to be detected, for example in the case of a measurement of resistivity or resistance, but does not give information about the intensity of the contact force with the surface. An example of this embodiment is described in US Published Application 2008/238882.

For some applications it can nevertheless be useful to have information about this force, or about the contact pressure exerted, about the points of application of the force, in particular when it is desired that the touch surface is able to detect several points or areas of contact, especially simultaneously, and lastly about the direction of the applied force.

The invention aims to create touch surfaces which response makes it possible to quantify the system of contact forces that are applied to them.

The technology known from the prior art allowing this need to be met consists of realizing a test specimen, i.e. a deformable solid whose modes of deformation under the effect of a loading system are known or can be calculated by direct methods, said test specimen being deformed under the action of the forces applied to it. Then its deformation just needs to be measured in order to know, by reverse method, the loading system to which it is subjected. The deformation of the proof body is measured most often by strain gages, which provide a variation in an electrical property proportional to their elongation. However, the difficulty with this method lies in several aspects. Firstly, for this method to be effective the shape of the test specimen must be simple and its supporting conditions controlled. As an example, while it is easy to determine by reverse method the loading mode of a thin flat test specimen held by its periphery when the forces normal to this plane are applied at points sufficiently far from the edges, it becomes significantly more complicated to apply such a method if the surface of the test specimen is curved or if it is held in a more complex way.

In addition, the test specimen must be sufficiently deformable so that its deformation can be measured by gages. However, in many applications mentioned above a rigid touch surface is desired. Therefore strain gages that are especially sensitive must be used. U.S. Pat. No. 7,116,209 describes especially sensitive strain gages suitable for a deformation measurement known as longitudinal, i.e. tangential to the surface on which they are bonded. These gages of the prior art are based, in their measurement principle, on the variation in the resistivity of an assembly of conductive nanoparticles when the distance between said particles is modified under the effect of the deformation of the test specimen on which said gages are bonded. Such gages can be networked to accurately measure the deformation of a test specimen in response to various loading systems. However, this principle suffers from the same limitations as the other technologies of the prior art, namely that the touch function, i.e. the ability to measure an action essentially normal to the surface, is dependent on boundary conditions, on the shape of the test specimen and on the ability to evaluate the latter's stressing by reverse method, the gages measuring the deformations tangential to the functionalized surface.

OBJECT AND SUMMARY OF THE INVENTION

To overcome these disadvantages of the prior art, the invention proposes a device for detecting and quantifying a force applied on a surface known as a touch surface comprising:
 a test specimen;
 an electrically insulating substrate;
 a first electrode bound to the substrate and fixed in relation to said substrate;
 a second electrode;
 an assembly of conductive or semi-conductive nanoparticles in contact with the two electrodes;
 a measurement device providing proportional information with respect to an electrical property of the nanoparticles assembly, which property is measured between the first and second electrode, said electrical property being proportional to a variation in distance between the nanoparticles of the assembly;
 such that the test specimen consists in the nanoparticles assembly itself.

Thus, this invention uses the nanoparticles assembly itself as test specimen and allows a force, essentially normal to said assembly, to be quantified even if said assembly is deposited on a rigid surface. The substrate can be rigid or have some compressibility, and the deformations of the nanoparticles assembly can be decoupled from those of the functionalized surface by this device. Thus, unlike the prior art, where the substrate and its method of fixing onto the test specimen must ensure a perfect coupling between the deformations of the test specimen and the nanoparticles assembly, the device subject of the invention overcomes this constraint and offers more flexibility of realization in the shape and nature of the touch surfaces.

A "nanoparticles assembly" is constituted of one or more ensembles of nanoparticles bound to each other by a ligand within each ensemble, said ensembles being bound to each other electrically.

"Proportional information" means a measurement that varies with the property measured, the proportionality function being linear, exponential or any other mathematical form establishing a univalent relationship between the value of the measurement and the value of the measured property.

The invention can be implemented according to the advantageous embodiments described below, which can be considered individually or in any technically effective combination.

According to a first embodiment, the second electrode is remote from the first electrode and mobile relative to the substrate, and the nanoparticles assembly is located between the two electrodes such that a movement of the second electrode causes a change in the distance between the nanoparticles of said nanoparticles assembly. This configuration makes it possible to create a basic force sensor able to measure the force it is subjected to at each of its extremities, i.e. on each of its electrodes. "An electrode mobile relative to the substrate" means an electrode placed such that a movement of the latter changes the relative distance between this electrode and the substrate, thus causing a change in the distance between the nanoparticles. This movement is in reality a micro-displacement, which is opposed by a back-moving force that is a function of the stiffness of the nanoparticles assembly and the substrate.

Advantageously, regardless of the configuration of realization, the electrical property measured is the resistance of the nanoparticles assembly. This electrical property is particularly easy to measure.

Alternatively, the electrical property measured is the electrical capacitance of the nanoparticles assembly. This electrical property offers the advantage of being suitable for being measured remotely, without contact, in all the realization configurations.

According to an improvement of the first realization configuration,
- the first electrode comprises a plurality of parallel conductive strips extending over the surface of the substrate in a first direction;
- the second electrode comprises a plurality of parallel conductive strips in a second direction different to the first;
- the nanoparticles assembly being topographically structured in a plurality of discrete clusters, said clusters being located between the two electrodes at the locations where the directions of the first and second electrodes' conductive strips intersect.

In this way the touch surface is made functional by a matrix network of basic force sensors, and offers the possibility of determining the points of application of forces stressing said surface and also the intensity of said forces.

According to a second embodiment, the nanoparticles assembly is placed on the substrate, covering a part of the surface of said substrate, and the electrodes consist in conductive strips bound to the substrate and extending between a portion of the surface of said substrate not covered by the nanoparticles assembly and the perimeter of the surface covered by the nanoparticles. This configuration allows the touch surface to be functionalized in a spatially continuous way.

According to a third embodiment, the nanoparticles assembly is placed on the substrate, covering a part of the surface of said substrate, the first electrode consist in conductive strips bound to the substrate and extending between a portion of the surface of said substrate not covered by the nanoparticles assembly and the perimeter of the surface covered by the nanoparticles and the second electrode, mobile relative to the substrate, is located on top of the nanoparticles assembly. This configuration makes it possible to quantify the force applied to the second electrode acting on the nanoparticles assembly, in intensity and orientation.

According to a first variant of the second and third embodiments, the nanoparticles assembly comprises several superimposed layers of nanoparticles in a direction substantially normal to the substrate.

According to a second variant of these same embodiments, the nanoparticles assembly extending on the surface of the substrate is a single layer, said substrate being compressible with regard to normal stresses such that a localized pressure normal to the substrate produces a change in the distance between the nanoparticles of said assembly.

The invention also relates to a method for manufacturing a touch surface according to the first embodiment, said method comprising steps consisting in:
- depositing on an insulating substrate a first network of parallel conductive strips extending in a first direction;
- depositing clusters of nanoparticles on these strips, which clusters comprise at least two superimposed layers of nanoparticles in a direction normal to the substrate, the clusters being separated from each other and deposited according to a repeating pattern in a direction parallel to the direction of the strips;
- depositing on the ensemble a second network of parallel conductive strips extending in a second direction different to the first and coming into contact with the nanoclusters.

Thus, such a surface can be prepared by known methods, in particular by photolithography or by nanoimprinting for depositing electrodes and by convective capillary deposition or nanoxerography for the nanoclusters.

According to a particular embodiment of this method, the step of depositing nanoclusters according to a repeating pattern comprises steps consisting of:
- depositing on the substrate/first network of conductive strips ensemble an insulating layer comprising holes opening onto said strips;
- depositing in the holes of the insulating layer nanoclusters comprising at least two superimposed layers in a direction substantially normal to the substrate and coming into contact with the underlying conductive strips;
- depositing on the ensemble a second network of parallel conductive strips extending in a second direction different to the first and coming into contact with the nanoclusters.

This embodiment of the method can be implemented with the same means and presents increased reliability of realization.

Advantageously, when the electrical property measured is proportional to the capacitance of the nanoparticles assembly, the measurement device comprises a resonant circuit coupling in parallel the nanoparticles assembly and a tuned inductance. In this way it is possible to take a measurement remotely without contact, by exciting said circuit by electromagnetic excitation.

To this end, the invention also relates to a method for measuring a force applied on such a device according to this last embodiment, said method comprising steps consisting of:
- subjecting the resonant circuit to an electromagnetic excitation;
- measuring the variation in absorption of said circuit when the nanoparticles assembly is subjected to said force.

This method allows the variation in electrical capacitance of the nanoparticles assembly to be used as a property proportional to the force applied on the touch surface, which capacitance is measured without contact and remotely.

According to a first variant of this method, the electromagnetic excitation is realized at a continuous excitation frequency and the variation measured is the frequency shift of the circuit's absorption spectrum. Advantageously, the excitation is realized at the circuit's resonance frequency and the variation measured is the shift in this resonance frequency.

According to a second variant of this method, the electromagnetic excitation is realized at a pulsed frequency, and the variation measured is the emission of the resonant circuit during the relaxation phases.

Advantageously, the resonant circuit comprises means emitting a unique identification code when said circuit is subjected to an electromagnetic excitation.

The invention also relates to a touch surface comprising the device object of the invention according to any one of its embodiments.

BRIEF DESCRIPTION OF THE DRAWINGS

The invention will now be described more precisely in the context of preferred embodiments, which are in no way limiting, and FIGS. 1 to 8 wherein:

FIG. 1 shows in perspective a schematic diagram of a first embodiment of a basic force sensor;

FIG. 2 shows in perspective a synoptic of an embodiment of the method of manufacturing a touch surface consisting of a matrix network of basic force sensors;

Figure 3:
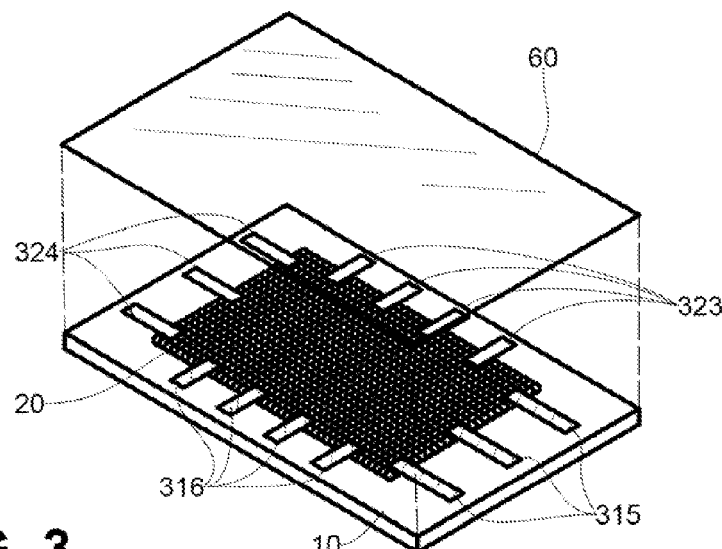
FIG. 3 shows in perspective an exemplary embodiment of a touch surface comprising a nanoparticles assembly, the measurement electrodes being placed on the perimeter of this nanoparticles assembly.

The purpose of all these figures is to show in an understandable way the structural characteristics of the device according to its various embodiments and they are in no way representative of the dimensions or scale of the various components.

DETAILED DESCRIPTION OF THE EMBODIMENTS

FIG. 1: according to a first exemplary embodiment of a device according to the invention comprising a nanoparticles assembly consisting of several superimposed layers, said device comprises an electrically insulating substrate (10) to which a first electrode (31) is bound, such that this first electrode is fixed in relation to said substrate. Measurement means (40) make it possible to measure the variation in an electrical property between this first electrode (31) and a second electrode (32) placed in a remote plane substantially parallel to the substrate (10). A nanoparticles assembly (20) is placed between the two electrodes (31, 32). This assembly comprises a plurality of conductive or semi-conductive nanoparticles (21), organized in several layers, said nanoparticles being bound to each other by an electrically resistant ligand. This ligand is advantageously chosen from compounds comprising functions able to bond chemically with the nanoparticles. As a non-limiting example it can concern citrate, amine, phosphine or thiol functions. As an example:
- sodium citrate, $O_6H_5O_7^{3-}$, $3Na^+$, for a compound comprising a citrate function;
- bis-p-sulfonatophenyl phenylphosphine dihydrate of sodium for a compound comprising a phosphine function;
- an alkylamine, $C_{12}H_{25}NH_2$, for a compound comprising an amine function.

The particles are deposited on the substrate in the form of a colloidal suspension, suspended in water for the ligands comprising a phosphine or citrate function, suspended in toluene for the ligands comprising an amine function.

The dimension of the nanoparticles (21) is between $2.10^{-9}$ meters or nanometers, and can reach 1 µm, such that the thickness of the assembly (20) of nanoparticles between the two electrodes (31, 32) is between $2.10^{-9}$ and $100.10^{-6}$ meters, depending on the dimension of the nanoparticles and the number of layers deposited. The nanoparticles are, for example, nanoparticles of gold.

The ensemble comprising the first electrode (31), the nanoparticles assembly (20) and the second electrode (32) is advantageously covered by an insulating film (not shown). When a force substantially normal to the surface of the second electrode (32) is applied to this ensemble, this displaces the nanoparticles and changes the distance between them within said assembly. When an electrical property is sensitive to the distance between said nanoparticles, measuring this property with the help of suitable means (40) between the two electrodes provides proportional information with respect to the deformation of the nanoparticles assembly under the effect of the stress. According to this exemplary embodiment, said stress is applied to the second electrode in a way substantially normal to it. The substrate (10) can be either rigid or flexible, the nanoparticles assembly forms the test specimen of this microsensor (100). Such a microsensor can advantageously be used to measure forces, or any other physical dimension of the same type. For example, by depositing a micro-mass on the second electrode it can form a micro-accelerometer.

FIG. 2: in order to functionalize a touch surface of significant dimension and detect on this surface the coordinates of the point of application of the force, such microsensors (100) can be combined according to a matrix arrangement. To this end, a plurality of conductive strips (310 to 314) is deposited by any known deposition method on an insulating substrate (10) and forms the first electrode. According to an example of realization, an insulating layer (50) is then deposited, by any known method, such as photolithography, on said conductive strips (FIG. 2A). The insulating layer (50) is structured with holes (51) distributed according to a transverse pitch perpendicular to the extension direction of the conductive strips (310 to 314) and equal to the deposition pitch of said strips on the substrate in this same direction.

FIG. 2B: nanoclusters comprising at least two superimposed layers are deposited in the holes, in contact with the conductive strips (310 to 314), by any known method such as convective capillary deposition. Second conductive strips (320 to 322), extending in a different direction to that of the first conductive strips deposited on the substrate, are deposited on the surface of the insulating layer (50) such that said second conductive strips are in contact with the nanoclusters (200) placed in the holes (51) of the structured insulating layer (50), and form the second electrode. Preferably the deposition direction of the second conductive strips (320 to 322) forming the second electrode is perpendicular to the direction of the first conductive strips (310 to 314) deposited on the substrate. An insulating film (not shown) advantageously covers everything. According to an alternative embodiment, the insulating layer comprising a network of holes is not deposited and the nanoclusters are deposited in a structured way directly on the conductive strips forming the first electrode.

The ensemble can then be deposited on a surface to functionalize it and make it touch-sensitive. Alternatively, the substrate can itself form the functionalized surface.

When a pressure, e.g. from a finger or by means of a stylus, is applied on a surface made functional in this way, a larger or smaller area of said surface is affected by this pressure according to its mode of application. The distance between the nanoparticles of the clusters (200) located in this affected area is changed, thus changing an electrical property of coupling between the first electrode, placed on the substrate (10), and the second electrode, placed on the insulating layer (50) in contact with the clusters (200). For example this electrical property is resistivity.

Thus, by measuring the resistance between the first and second electrode proceeding by pairs of conductive strips, it is possible, via suitable processing of the measurements to locate the points of application of the force resulting from the pressure and also the intensity of said force. For example, if the force is applied at the center of the surface thus made functional, the resistance measured between the conductive strips (312, 321) passing by the middle of the surface will be affected more than the resistance measured between the conductive strips (314, 322) extending along the edges of said surface.

FIG. 3: according to a second embodiment, the device that is the subject of the invention comprises an insulating substrate (10), on which is deposited a nanoparticles assembly (20) covering most of its surface. Said nanoparticles assembly can be single-layered or comprise several layers superimposed in a direction normal to the surface of the substrate (10).

A first ensemble of conductive strips (315, 316) is deposited on the substrate so as to form the first electrode, such that said strips extend between a portion of the substrate not covered by the nanoparticles assembly and said assembly in contact with the latter. A second ensemble of strips (323, 324), forming the second electrode, is deposited in the same way as the first strips, in symmetry with them in relation to the center of the center of the nanoparticles assembly. Finally, an insulating film (60) is deposited over everything.

Figure 6:
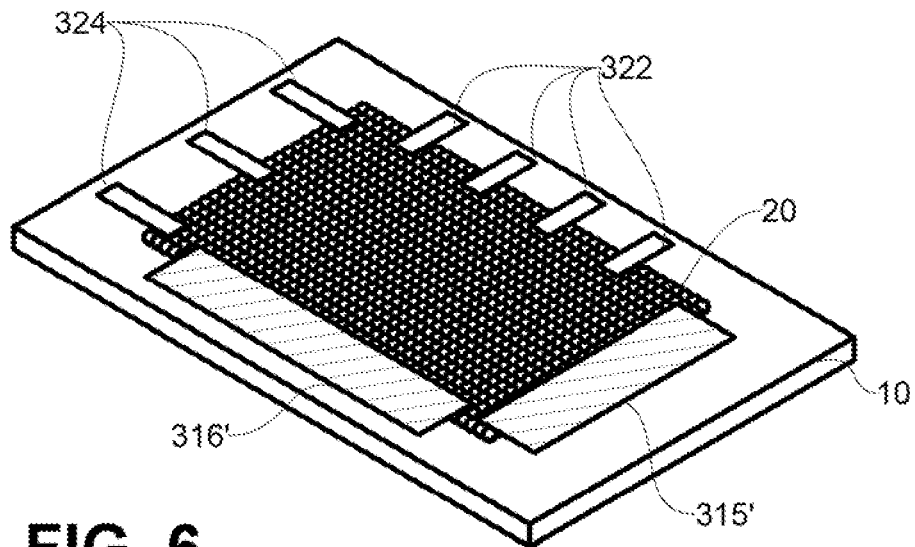
FIG. 6 shows in a top perspective view another embodiment variant of the device subject of the invention using a nanoparticles assembly, the electrodes being placed on the perimeter of the assembly, one of the electrodes being realized by a plurality of strips.

FIG. 6: according to a variant of this embodiment, the discrete strips forming the first electrode are grouped into one or more strips (315', 316').

Figure 4:
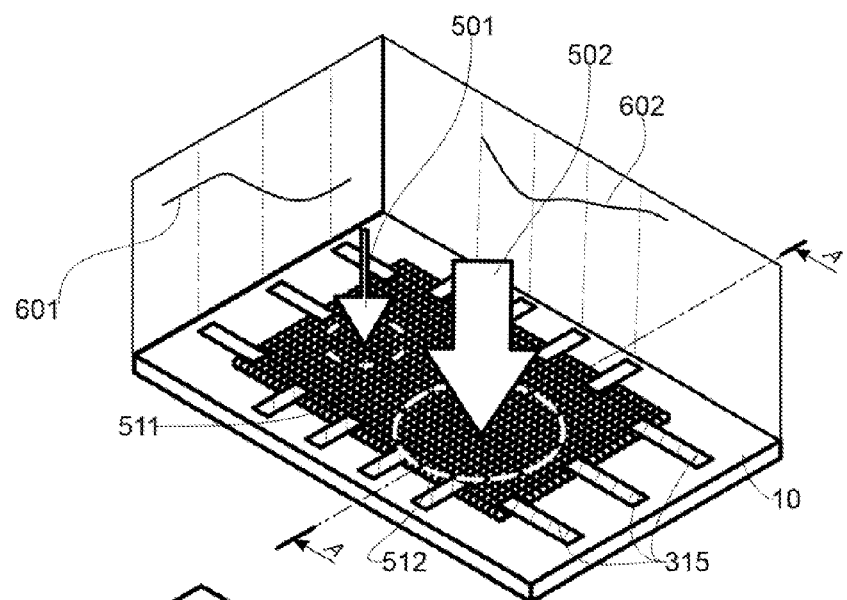
FIG. 4 illustrates according to the principle, in a perspective view, the response of a nanoparticles assembly similar to that in FIG. 3 subjected to a system of force.

FIG. 4: when a system of forces (501, 502) essentially normal to the surface thus functionalized is applied to said surface, this affects larger or smaller areas (511, 512) of the nanoparticles assembly. In these affected areas (511, 512), the distance between the nanoparticles of the assembly is changed, such that the electrical properties are also changed. By taking one or more measurements of an electrical property between the first electrode (315, 316) and the second electrode (322, 324) and by proceeding by pairs of conductive strips, profiles (601, 602) are obtained giving the variation in said electrical property as a function of the direction joining the two strips between which the measurement was taken. Based on these variation profiles, the intensity of the forces (501, 502) and also their point of application can be determined by suitable processing of the signal.

Figure 5:
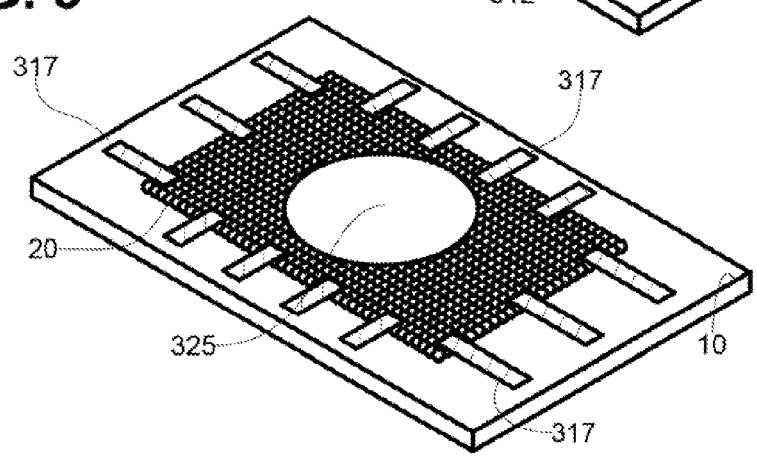
FIG. 5 shows, according to a top perspective view, an exemplary embodiment of a force sensor comprising a nanoparticles assembly and an ensemble of first electrodes distributed over the perimeter of the nanoparticles assembly, a second electrode being placed on the top of the nanoparticles assembly.

FIG. 5: according to a third embodiment, the device that is the subject of the invention comprises an insulating substrate (10) on which a nanoparticles assembly (20) covering a portion of the surface of said substrate is deposited. The first electrode is formed of an ensemble of strips (317) deposited on the substrate and extending between a portion of the substrate that is not covered and the nanoparticles assembly (20), in contact with the latter. The second electrode (325) is placed on the nanoparticles assembly, the ensemble being covered by an insulating film (not shown). When a force is applied to the second electrode (325), both the normal and tangential components of said force change the distance between the nanoparticles of the assembly (20). The point of application of the force being known, i.e. substantially at the center of the second electrode (325), measuring an electrical property between said second electrode (325) and each of the strips (317) forming the first electrode makes it possible to determine, by suitable processing of the signal, the intensity and orientation of the force with regard to the nanoparticles assembly. A three-dimensional force microsensor is thus created, which can be combined in a matrix network in order to cover a larger surface thus functionalized.

Figure 7:
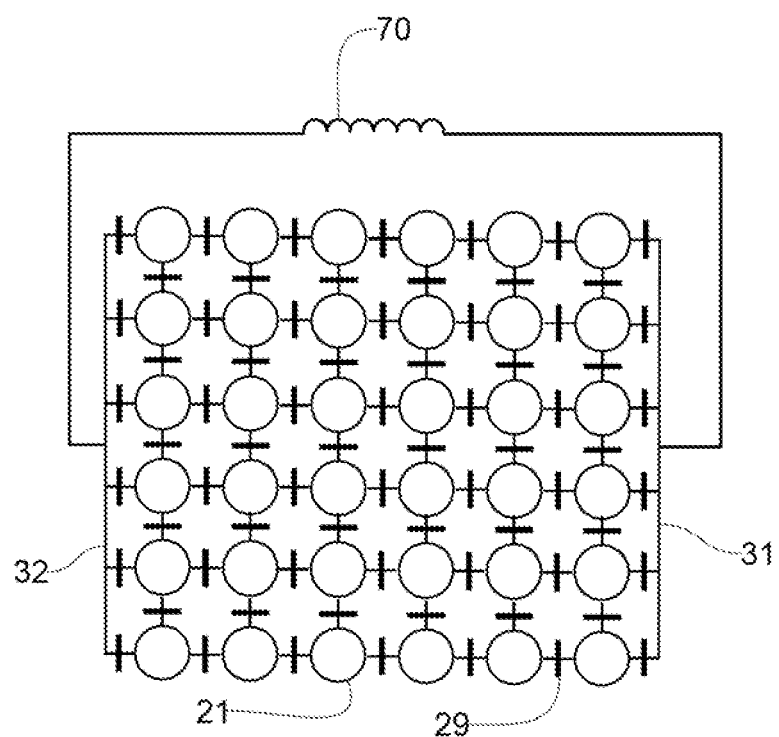
FIG. 7 is a schematic diagram of a device according to an embodiment of the invention using the electrical capacitance as property sensitive to the distance between the nanoparticles of the assembly.

FIG. 7: the electrical property sensitive to the distance between the nanoparticles of the assembly is, for example, the electrical resistivity of said assembly. The variation in this electrical property with the variation in distance between the nanoparticles of the assembly is known from the prior art and has been attributed to a variation in the tunnel effect between the nanoparticles, without the present invention being in any way linked to any theory. According to an alternative embodiment of the device that is the subject of the invention, it is possible to measure the variation in capacitance of said assembly. To this end, the conductive nanoparticles (21) are bound by a suitable ligand, chosen from the compounds described previously or from other compounds having great electrical resistivity and similar chemical bonding properties.

Each pair of nanoparticles separated by said ligand forms a nano-capacitor, whose capacitance (29) is notably a function of the distance between the conductive nanoparticles. Thus, in a similar way, the application of a force on this nanoparticles assembly changes the distance between said nanoparticles and the electrical capacitance of said assembly. This variation in capacitance between the electrodes (31, 32) can be measured by incorporating said assembly in series/parallel in an electrical circuit. This configuration offers the possibility of being able to read the measurement remotely by means of well-known protocols from the prior art of the radiofrequency field. To this end, a resonant circuit is, for example, realized by coupling an inductance (70) in parallel with the nanoparticles assembly.

Such a circuit is defined in particular by its resonance frequency ($f_0$), which is given by the relationship:

$$f_0 = \frac{1}{2\pi\sqrt{LC}}$$

where L is the value of the inductance, fixed, and C the capacitance of the nanoparticles assembly, which varies as a function of the stresses to which said assembly is subjected. Thus, by measuring the resonance frequency of such a circuit subjected to electromagnetic excitation, it is possible to determine the variation in capacitance of said assembly.

For example, the circuit is subjected to continuous electromagnetic excitation of frequency $f_0$. Initially, the system absorbs a lot at this frequency.

The presence of a deformation changes the absorption spectrum by shifting it to the higher or lower frequencies by changing the capacitance of the assembly. The absorption coefficient at frequency $f_0$ becomes changed.

According to another embodiment, the circuit is subjected to pulsed electromagnetic excitation of frequency $f_0$. After each excitation pulse, measuring the circuit's emission during its relaxation makes it possible to measure its absorption coefficient and to deduce from it the nanoparticles assembly's capacitance.

To select measurements by pairs of conductive strips, the device can be coupled to a component containing a unique identification code. This binary code can be used to activate or not each resonant circuit between a strip of the first electrode and a strip of the second electrode.

Figure 8:
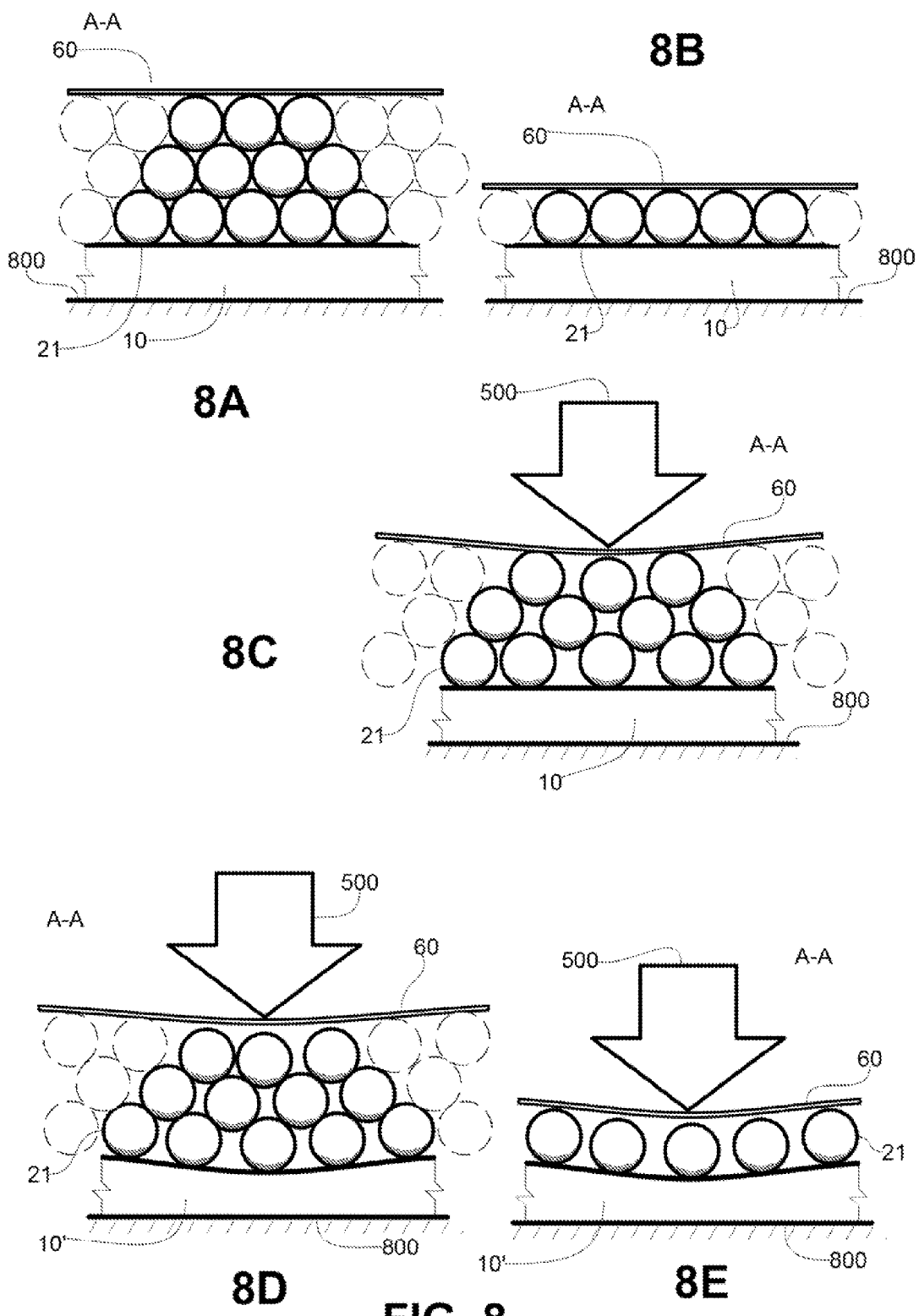
FIG. 8 shows, according to a cross-section and front view, the modes of deformation of the nanoparticles assembly of the subject of the invention placed on a functionalized surface, called touch, said assembly being single-layered (FIGS. 8B and 8E) or multi-layered (FIGS. 8A, 8C and 8D), which assembly being deposited on a rigid substrate (FIG. 8C) or on a compressible substrate (FIGS. 8D and 8E).

FIG. 8: the nanoparticles assembly deposited on the substrate (10) can be single-layered (FIG. 8B) or comprise several superimposed layers (FIG. 8A). In its turn the ensemble can be deposited or stuck on the surface (800) to be functionalized which, from a practical point of view, is then equivalent to the touch surface given the thinness of the device that is the subject of the invention.

FIG. 8C: in the case where a force (500) is applied to a nanoparticles assembly in a direction normal to the substrate (10), the distance between the nanoparticles of an assembly comprising several superimposed layers is changed both in a direction normal to the surface and in directions tangential to this surface.

FIG. 8E: in the case of a single-layered assembly, the application of a force (500) normal to the surface of the substrate can only be detected and measured if it produces a movement of the nanoparticles (21) tangential to the surface of said substrate. Thus, in the case of a single-layered assembly the substrate (10') is chosen such that it has some superficial flexibility or compressibility such that a normal force (500) causes this tangential movement of the nanoparticles. However, the nanoparticles assembly remains the test specimen because it is the deformation of this assembly itself that is measured, the compressibility of the substrate being only a factor analogous to a gain.

FIG. 8D: a superficially compressible substrate can also be used with a nanoparticles assembly formed of several superimposed layers.

The above description clearly illustrates that through its various features and their advantages the present invention realizes the objectives it set itself. In particular, it makes it possible to functionalize a touch surface to make it sensitive to the intensity and orientation of a system of forces stressing such a surface.

The invention claimed is:

1. A touch surface comprising:
    a measuring surface configured to detect a force applied on the measuring surface, and to determine a point of application and intensity of the force comprising a component normal to the measuring surface, the measuring surface comprises a plurality of nanoclusters arranged in a matrix pattern over the measuring surface, each cluster comprising:
    an electrically insulating substrate;
    a first electrode bound to the electrically insulating substrate and fixed in relation to the electrically insulating substrate;
    a second electrode;
    an assembly of conductive or semi-conductive nanoparticles bound together by an electrically resistant ligand able to chemically bound with the nanoparticles of the assembly, the assembly being structured and organized in at least two superimposed layers according to a direction normal to the electrically insulating substrate;
    a measurement device to provide proportional information with respect to an electrical property of the nanoparticles assembly, the electrical property is measured between the first and second electrodes; and
    wherein the second electrode is superimposed to the first electrode in a direction that is normal to the substrate, the nanoparticles assembly being comprised in between the two electrodes, so that the application of the force on the second electrode, according to a direction that is normal to the substrate, changes the distance between the nanoparticles of the assembly, the assembly of nanoparticles thus constituting itself a test specimen.

2. The touch surface according to claim 1, wherein the electrical property is the resistance of the nanoparticles assembly.

3. The touch surface according to claim 1, wherein the electrical property is an electrical capacitance of the nanoparticles assembly.

4. The touch surface according to claim 1, wherein:
    the first electrode comprises a plurality of parallel conductive strips extending over the surface of the substrate in a first direction;
    the second electrode comprises a plurality of parallel conductive strips extending in a plane remote from and parallel to the surface of the substrate and in a second direction different to the first; and
    the nanoparticles assembly, being topographically structured in a plurality of discrete clusters and located between the two electrodes at the locations where the directions of the first and second electrodes' conductive strips intersect.

5. The touch surface according to claim 1, wherein the nanoparticles assembly is located on the electrically insulating substrate, covering a part of the functionalized touch surface, and wherein the first and second electrodes comprise conductive strips bound to the electrically insulating substrate and extending between a portion of the functionalized touch surface of the electrically insulating substrate not covered by the nanoparticles assembly and the a perimeter of the functionalized touch surface covered by the nanoparticles.

6. The touch surface according to claim 1, wherein the nanoparticles assembly is located on the electrically insulating substrate, covering part of the functionalized touch surface, the first electrode comprising conductive strips bound to the electrically insulating substrate and extending between a portion of the functionalized touch surface of the electrically insulating substrate not covered by the nanoparticles assembly and the a perimeter of the functionalized touch surface covered by the nanoparticles and the second electrode, wherein the second electrode being mobile relative to the electrically insulating substrate is located on top of the nanoparticles assembly.

7. A method for manufacturing a touch surface according to claim 4, comprising the steps of:
depositing a first network of parallel conductive strips extending in a first direction on an insulating substrate, and constituting the first electrode;
depositing an insulating layer comprising holes for receiving the nanoclusters, opening onto the first network of strips on an ensemble comprising the substrate and the first network of strip;
depositing clusters of nanoparticles on the first network of parallel strips, in the holes of the insulating layer, the nanoclusters comprising at least two superimposed layers in a direction substantially normal to the surface of the substrate and coming into contact with the underlying conductive strips; and
depositing a second network of parallel conductive strips, constituting the second electrode, extending in a second direction different to the first network of strips and coming into contact with the nanoclusters.

8. The touch surface according to claim 3, wherein the measurement device comprises a resonant circuit coupling in parallel the nanoparticles assembly and a tuned inductance.

9. A method for measuring a force applied on a touch surface according to claim 8, comprising the steps of:
subjecting the resonant circuit to electromagnetic excitation; and
measuring the variation in absorption of the resonant circuit in response to the nanoparticles assembly being is subjected to the force changing the distance between the nanoparticles of the assembly.

10. The method according to claim 9, wherein the electromagnetic excitation is realized at a continuous excitation frequency and the variation measured is the frequency shift of the resonant circuit's absorption spectrum.

11. The method according to claim 9, wherein the electromagnetic excitation is realized at a pulsed frequency, and the variation measured is the emission of the resonant circuit during the relaxation phases.

12. The method according to claim 10, wherein the excitation is realized at the resonant circuit's resonance frequency and the variation measured is the shift in the resonance frequency.

13. The touch surface according to claim 8, wherein the resonant circuit comprises an emitter to emit a unique identification code in response to the resonant circuit being subjected to an electromagnetic excitation.

* * * * *